(12) United States Patent
Triantafyllou et al.

(10) Patent No.: US 6,841,869 B1
(45) Date of Patent: Jan. 11, 2005

(54) ELECTRONIC PACKAGE ASSEMBLY

(75) Inventors: Markos Triantafyllou, Munich (DE); Will Specks, Munich (DE); Claude Escoffre, Munich (DE)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 10/031,296

(22) PCT Filed: Jun. 21, 1999

(86) PCT No.: PCT/EP99/04291

§ 371 (c)(1),
(2), (4) Date: Mar. 12, 2002

(87) PCT Pub. No.: WO00/01060

PCT Pub. Date: Oct. 6, 2000

(30) Foreign Application Priority Data

Jun. 27, 1998 (GB) .......................................... 98138888

(51) Int. Cl.[7] .............................................. H01L 23/34
(52) U.S. Cl. ...................... 257/723; 257/724; 257/779; 257/782; 257/698
(58) Field of Search ................................. 257/723–724, 257/779–780, 698, 782, 774, 690, 676

(56) References Cited

U.S. PATENT DOCUMENTS

| 3,972,062 A | * | 7/1976 | Hopp ......................... 257/778 |
| 4,965,710 A | | 10/1990 | Pelly et al. .................... 363/56 |
| 5,532,512 A | | 7/1996 | Fillion et al. ................ 257/686 |
| 6,324,072 B1 | * | 11/2001 | Lorenz et al. .............. 361/803 |

FOREIGN PATENT DOCUMENTS

| DE | 3531235 | 4/1986 | ............ H05K/1/18 |
| DE | 9603224 | 7/1997 | ............ H05K/7/20 |

* cited by examiner

*Primary Examiner*—Luan Thai

(57) ABSTRACT

An electronic package assembly includes a number of semiconductor devices with first and second sides. A printed circuit substrate has a number of printed circuit patterns bonded to conductive pads of the first sides of the devices. A metal leadframe includes leads which provide external connections for the package assembly, and also includes a non-lead island portion bonded to conductive pads of the second sides of the devices. In this way the island portion of the leadframe forms an interconnection between the second sides of the devices.

10 Claims, 3 Drawing Sheets

ELECTRONIC PACKAGE ASSEMBLY

FIELD OF THE INVENTION

This invention relates to an electronic package assembly and preferably but not exclusively to an electronic package assembly incorporating a power transistor.

BACKGROUND OF THE INVENTION

In many electronic applications, particularly in automotive applications, power and logic devices are used in conjunction with each other, to perform a single function.

For example, an electric motor for operating an automatic sunroof or a window of a vehicle is typically actuated by a high-sided switch formed by power transistors. In order to reduce power consumption, the high-sided switch is ideally placed as close as possible to the electric motor, thus keeping the length of high current paths to a minimum and hence reducing unnecessary power losses.

Typically the driver of a vehicle may prefer to operate a separate switch on the dashboard of the vehicle, which then sends a (low-power) signal to the high-sided switch, in order to actuate it. Therefore a certain amount of logic circuitry is required, preferably at the high-sided switch, in order to control the actuation and other ancillary functions, such as fail-safe features.

Therefore there is a need to incorporate logic integrated circuits and power transistors into a single package module, which is ideally adapted to be mounted on or in close proximity to the electric motor.

A problem with existing combined logic/power packages is that the high power requirements of the high-sided switch do not easily facilitate integration with low power logic integrated circuits. The high currents involved preclude the use of conventional wire bond techniques, and the thermal management of heat dissipation presents further problems.

This invention seeks to provide an electronic package assembly which mitigates the above mentioned disadvantages.

SUMMARY OF THE INVENTION

According to the present invention there is provided an electronic package assembly comprising: a plurality of semiconductor devices, each having a first side with a plurality of conductive pads, at least two of the plurality of devices being vertical power transistor devices having a second side opposite the first side, the second side having further conductive pads; a printed circuit substrate, having a plurality of printed circuit patterns bonded to the conductive pads of the first sides of the plurality of semiconductor devices, and arranged to provide logic interconnections between the plurality of semiconductor devices; and, a lead frame including leads which provide external connections for the package assembly, and having a non-lead island portion bonded to the further conductive pads of the second sides of the at least two vertical power transistor devices, wherein the island portion of the lead frame forms a power interconnection between the at least two vertical power transistor devices.

Preferably the lead frame further comprises a substrate lead portion, which is arranged to connect to a further pad of the printed circuit substrate, thereby directly connecting the lead frame to the substrate. The substrate lead portion is preferably connected to the island portion of the lead frame such that the conductive pads of the second sides of the semiconductor devices are directly electrically connected to the substrate.

Preferably a discrete electronic device is mounted directly onto the lead frame. The leadfamne preferably has contact bumps to which the electronic device is coupled.

The semiconductor device may be a vertical H-bridge power transistor device. Alternatively, the semiconductor device may be a full-bridge high-sided switch arrangement.

The substrate preferably has a first face having the plurality of pads, and a second face opposite the first face to which further electronic devices are attached. Preferably the substrate is provided with electrical vias arranged to electrically interconnect the first and the second faces of the substrate. Preferably the substrate is also provided with thermal vias arranged to sink heat away from the semiconductor device.

In this way an electronic package assembly is provided which has improved integration and good thermal management.

BRIEF DESCRIPTION OF THE DRAWINGS

An exemplary embodiment of the invention will now be described with reference to the drawing in which.

DETAILED DESCRIPTION OF A PREFERRED EMBODIMENT

Figure 1:
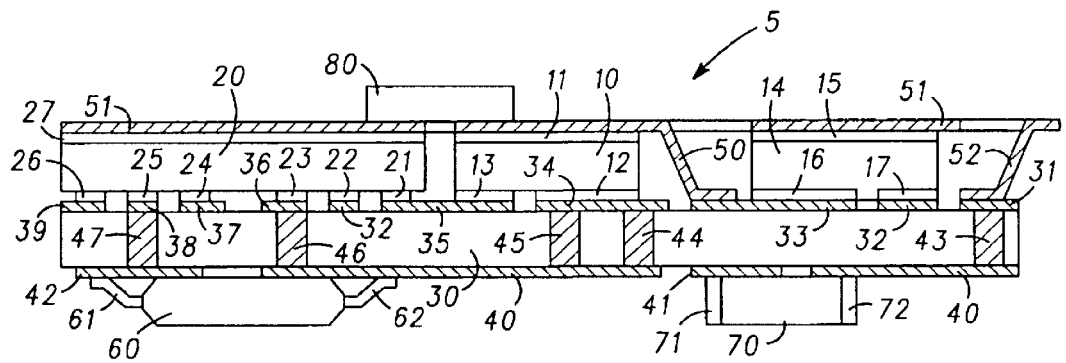
FIG. 1 shows a preferred embodiment of an electronic package assembly in accordance with the invention.

Referring to FIG. 1, there is shown an electronic package assembly 5 comprising double-sided leadless components (10, 14, 20) a printed circuit substrate 30, a lead frame comprising first (50) second (51) and third (52) elements and other electronic components (60, 70).

The substrate 30 is a multi-layered substrate of dielectric material and has top and bottom faces. The top face has a first set of printed circuit patterns 31–39, which facilitate connection of the substrate 30 to the double-sided leadless components (10, 14, 20) and also to the selected elements of the lead frame (50 and 52) to be further described below.

The substrate 30 also has a second set of printed circuit patterns 40–42 on the bottom face thereof. These second patterns 40–42 facilitate connection of the substrate 30 to the other electronic components (60, 70) which may be single or multiple packaged components. The first component 60 may be a packaged integrated circuit having electrical terminals 61 and 62 in the form of leads, and the second component 70 may be discrete device having electrical terminals 71 and 72 in the form of edge connectors.

The substrate also has a number of conductive vertical vias (43–47) which provide electrical and thermal paths between the top and the bottom faces of the substrate 30.

The double-sided leadless components (10, 14, 20) comprise first 10 and second 14 power switching transistors and an integrated circuit 20.

The first power switching transistor 10 may be a metal-oxide field effect transistor (MOSFET) or a bipolar transistor, and has a first electrode 11 (drain electrode) in the form of a pad located on an upper face and second and third electrodes 12 and 13 (source and gate electrodes respectively) in the form of pads located on a lower face. The second and third electrodes 12 and 13 form pads which are bonded via flip-chip solder bumps (of low thermal and electrical resistivity) to the printed circuit patterns 34 and 35 respectively of the substrate 30.

The second power switching transistor 14, which may also be a MOSFET or a bipolar transistor, has a first electrode 15 (drain electrode) in the form of a pad located on an upper face and second and third electrodes 16 and 17 (source and gate electrodes respectively) in the form of pads located on a lower face. The second and third electrodes 16 and 17 are bonded to the printed circuit patterns 33 and 32 respectively of the substrate 30.

In this way the first and second power switching transistors 10 and 14 respectively have vertical current paths between the upper and the lower faces (between drain and source electrodes).

The integrated circuit 20 may contain logic circuitry or similar, and has a lower face with pads 21 to 26 which are bonded to the printed circuit patterns 35, 32, 36 to 39 respectively. An optional further pad 27 may be provided on an upper face, to be further described below.

The lead frame is a plurality of unsupported (i.e. non-substrate supported) metal leads, including first (50) second (51) and third (52) elements. The first element 50 connects the printed circuit pattern 33 to the pad of the drain electrode 11 of the first power switching transistor 10 via bonds at both ends. Since the first element 50 does not form an external pin connection, it is regarded as an 'island' portion of the lead frame. The second element 51 has a first arm bonded to the further pad 27 of the integrated circuit 20, and a second arm bonded to the pad forming the drain electrode 15 of the second power switching transistor 14. The first and second arms of the second element 51 are connected in a section of the assembly 5 which is not shown. The third element 52 is bonded to the printed circuit pattern 31 of the substrate 30. The second element 51 and the third element 52 of the lead frame form power supply and ground terminals respectively (via external pins, not shown) and they are regarded as 'lead' portions.

Further circuit elements may be provided which are directly bonded to the lead frame. An example is shown in the form of component 80, which is attached between the first element 50 and the second element 51 of the lead frame 30.

Figure 2:
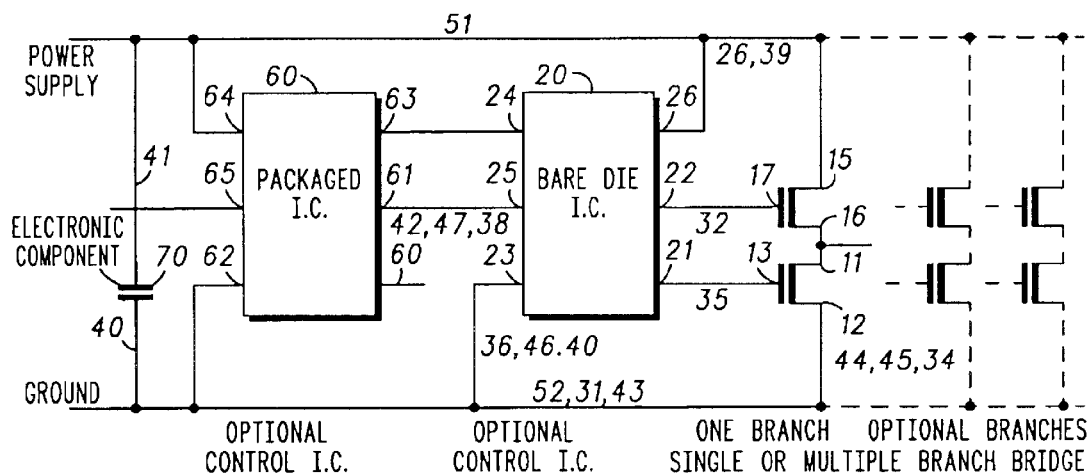
FIG. 2 shows a block schematic diagram of the assembly of FIG. 1.

Referring now also to FIG. 2, there is shown a block schematic diagram of the electronic package assembly 5, where each element of FIG. 2 has the same number as the corresponding of the assembly 5 of FIG. 1, with the exception of leads 63, 64 and 65, (which occupy a different plane of assembly 5 from that shown in FIG. 1) and component 80, which is exemplary only in FIG. 1 and therefore not shown in FIG. 2.

The integrated circuit 20, (which may be bare die, as illustrated) has various connections formed by the pads 21 to 26 and printed circuit patterns 35, 32, 36 to 39. In particular the printed circuit patterns 35 and 32 connect the integrated circuit 20 to the first and second power switching transistors 10 and 14 respectively.

Similarly the electronic component 60 (which may be a packaged integrated circuit, as illustrated) has various connections formed by the leads 61 to 65.

FIG. 2 also shows further optional power transistor stages (or branches) which could easily be formed in the assembly 5.

The first (drain) electrodes 11 and 15 of the first and second power switching transistors 10 and 14 respectively and those of the further optional power transistor stages, are arranged to convey a large amount of current during operation, and the leadframe to which they are attached is specifically arranged to provide high current capacity.

In this way the PCB 30 provides logic interconnects for the assembly 5, and the lead frame provides power interconnects as well as external connections.

Figure 3:
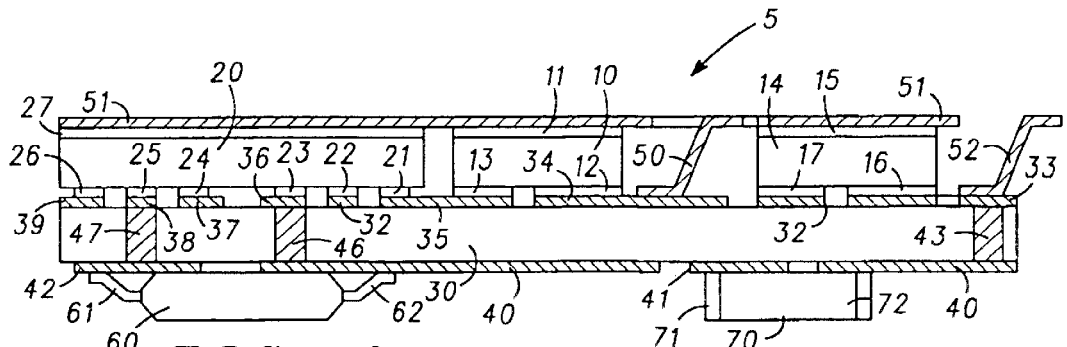
FIG. 3 shows an alternative embodiment of an electronic package assembly in accordance with the invention.
Figure 4:
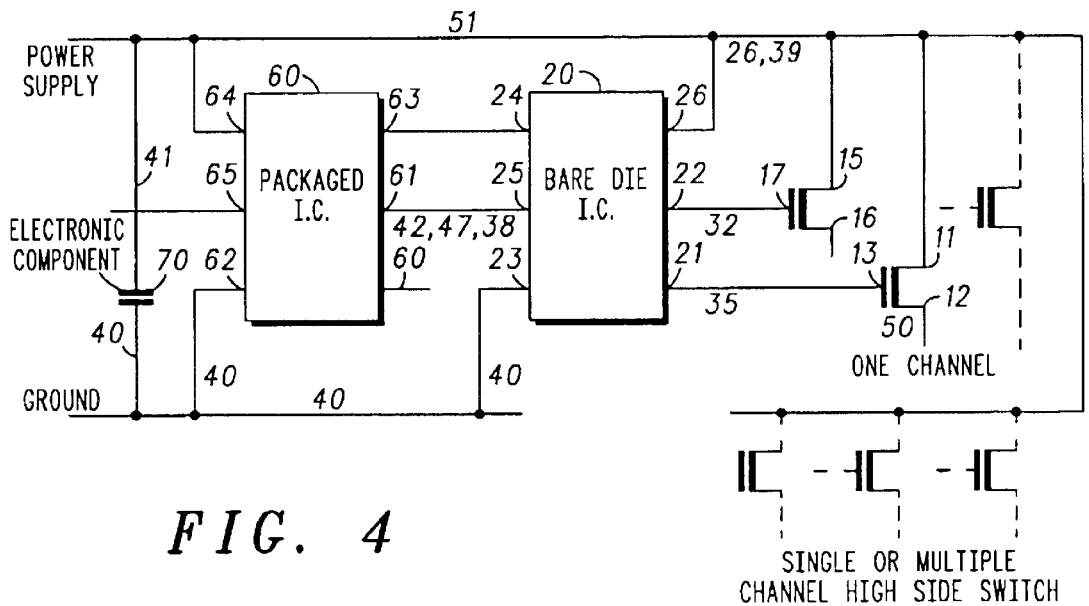
FIG. 4 shows a block schematic diagram of the assembly of FIG. 3.

Referring now also to FIG. 3 and FIG. 4, there is shown an alternative arrangement of the assembly 5, having the same components with the same reference numerals. In this alternative arrangement, the first element 50 of the lead frame 30 is not arranged to connect the printed circuit pattern 33 to the drain electrode (pad 11) of the first power switching transistor 10. In this way a high-sided switch is formed instead of a bridge.

Figure 5:
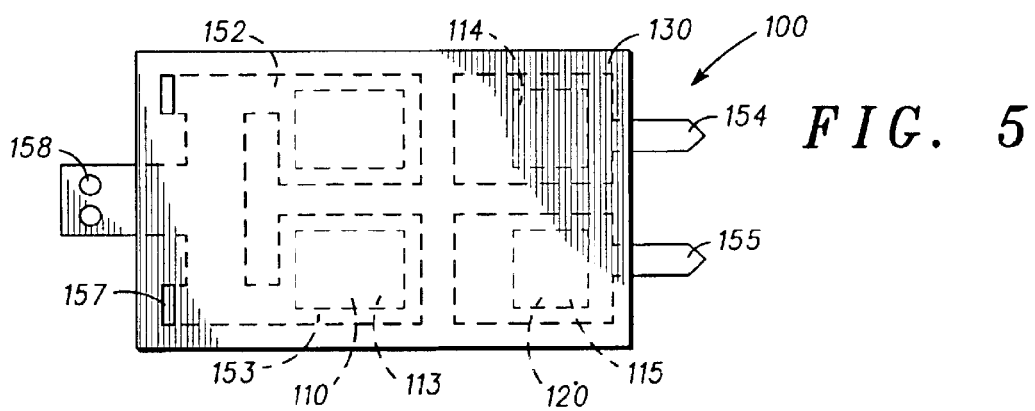
FIG. 5 and FIG. 5B respectively show a top and a side view of an exemplary lead frame forming part of the assembly of FIG. 1 or FIG. 3.
Figure 5B:
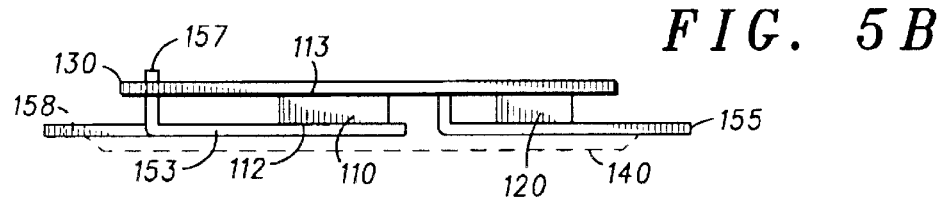

Referring now also to FIG. 5, there is shown a top view and a side view of a physical lead frame arrangement 100, having a substrate 130, on which a double-sided leadless semiconductor device 110 is mounted. Pads 112 and 113 of the semiconductor device 110, which are only shown in the top view, connect the semiconductor device 110 to 'island' portions 152 and 153 respectively of a lead frame. A further portion 157 of the lead frame, which is integral to portions 152 and 153, provides a vertical connection to the substrate 130. A stub portion 158 provides yet another connection of the lead frame, which may be to a further device, a further substrate, or to the substrate 130.

Figure 5A:
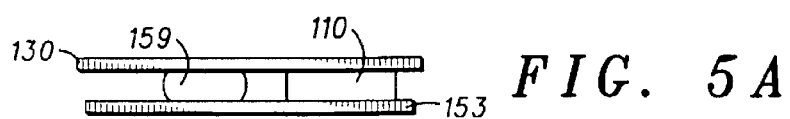
FIG. 5a shows an alternative embodiment of the side view of FIG. 5B.

In an alternative embodiment illustrated in FIG. 5a, the further portion 157 of the substrate is replaced by a solder ball 159, which provides a connection to the substrate 130.

A further double-sided leadless semiconductor device 120 is also mounted on the substrate 130. Pads 114 and 115 of the semiconductor device 120, which are only shown in the top view, connect the semiconductor device 120 to portions 154 and 155 respectively of the lead frame. The portions 154 and 155 have pin protrusions which extend beyond an encapsulation 140 (shown by the dashed line of the side view), such that the pin protrusions provide external connections for the devices 110 and 120.

Figure 6:
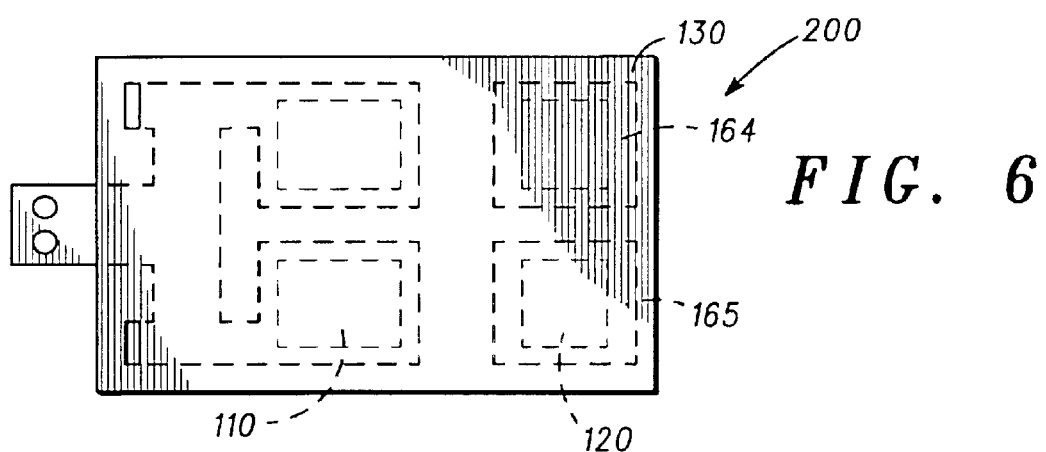
FIG. 6 and 6A respectively show a top and a side view of an alternative exemplary leadframe forming part of the assembly of FIG. 1 or FIG. 3.
Figure 6A:
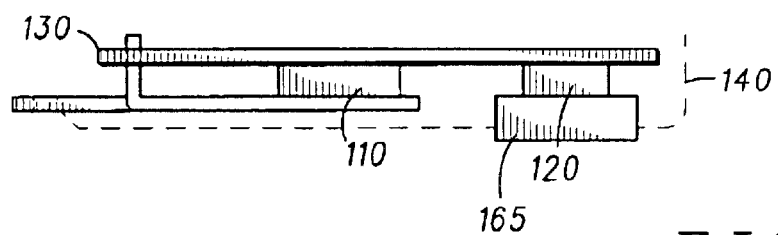

Referring now also to FIG. 6, there is shown an alternative lead frame arrangement 200, which is identical to the arrangement 100 of FIG. 5 except that the lead frame portions 154 and 155 have been replaced with raised lead frame pads 164 and 165. These pads 164 and 165 extend beyond the encapsulation 140, as shown by the dashed line of the side view, and hence provide an alternative form of external connection for the devices 110 and 120.

It will be appreciated that further alternative embodiments to those described above are possible. For example, it is envisaged that two or more printed circuit substrates could be incorporated into the assembly 5, using flip-chip techniques with double-sided components to replace the components 60 and 70.

Furthermore other combinations of interconnections and leads of the leadframes shown above are possible.

What is claimed is:

1. An electronic package assembly, comprising:
   a plurality of semiconductor devices, each having a first side with a plurality of conductive pads, at least two of the plurality of devices being vertical power transistor devices having a second side opposite the first side, the second side having further conductive pads;

a printed circuit substrate, having a plurality of printed circuit patterns bonded to the conductive pads of the first sides of the plurality of semiconductor devices, and arranged to provide logic interconnections between the plurality of semiconductor devices; and, a leadframe including leads which provide external connections for the package assembly, and having a non-lead island portion bonded to the further conductive pads of the second sides of the at least two vertical power transistor devices, wherein the island portion of the leadframe forms a power interconnection between the at least two vertical power transistor devices.

2. The assembly of claim 1 wherein the leadframe further comprises a substrate lead portion, which is arranged to connect to a further pad of the printed circuit substrate, thereby directly connecting the leadframe to the substrate.

3. The assembly of claim 2 wherein the substrate lead portion is connected to the island portion of the leadframe such that the conductive pads of the second sides of the semiconductor devices are directly electrically connected to the substrate.

4. The assembly of claim 1 wherein a discrete electronic device is mounted directly onto the leadframe.

5. The assembly of claim 4 wherein the leadframe has contact bumps to which the electronic device is coupled.

6. The assembly of claim 1 wherein the at least two semiconductor devices form a vertical H-bridge power transistor arrangement.

7. The assembly of claim 1 the at least two semiconductor devices form a full-bridge high-sided switch arrangement.

8. The assembly of claim 1 wherein the substrate has a first face having the plurality of pads and a second face opposite the first face to which further electronic devices are attached.

9. The assembly of claim 8 wherein the substrate is provided with electrical vias arranged to electrically interconnect the first and the second faces of the substrate.

10. The assembly of claim 1 wherein the substrate is provided with thermal vias arranged to sink heat away from the semiconductor device.

* * * * *